(12) United States Patent
Shim et al.

(10) Patent No.: US 7,746,656 B2
(45) Date of Patent: *Jun. 29, 2010

(54) OFFSET INTEGRATED CIRCUIT PACKAGE-ON-PACKAGE STACKING SYSTEM

(75) Inventors: Il Kwon Shim, Singapore (SG); Byung Joon Han, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 624 days.

This patent is subject to a terminal disclaimer.

(21) Appl. No.: 11/383,407

(22) Filed: May 15, 2006

(65) Prior Publication Data

US 2006/0256525 A1    Nov. 16, 2006

Related U.S. Application Data

(60) Provisional application No. 60/594,887, filed on May 16, 2005.

(51) Int. Cl.
H05K 7/00 (2006.01)

(52) U.S. Cl. .......................... 361/760; 174/260

(58) Field of Classification Search ................. 361/760, 361/761, 790; 174/260
See application file for complete search history.

(56) References Cited

U.S. PATENT DOCUMENTS

| | | | |
|---|---|---|---|
| 5,579,207 A | 11/1996 | Hayden et al. | |
| 5,748,452 A | 5/1998 | Londa | |
| 5,854,507 A | 12/1998 | Miremadi et al. | |
| 5,903,049 A | 5/1999 | Mori | |
| 5,907,903 A * | 6/1999 | Ameen et al. | 29/830 |
| 5,963,430 A | 10/1999 | Londa | |
| 6,101,100 A | 8/2000 | Londa | |
| 6,239,496 B1 | 5/2001 | Asada | |
| 6,388,333 B1 * | 5/2002 | Taniguchi et al. | 257/777 |
| 6,410,983 B1 | 6/2002 | Moriizumi et al. | |
| 6,433,412 B2 * | 8/2002 | Ando et al. | 257/678 |
| 6,518,659 B1 | 2/2003 | Glenn | |
| 6,605,875 B2 | 8/2003 | Eskildsen | |
| 6,667,544 B1 | 12/2003 | Glenn | |
| 6,731,009 B1 | 5/2004 | Jones et al. | |
| 6,740,980 B2 | 5/2004 | Hirose | |
| 6,798,057 B2 | 9/2004 | Bolkin et al. | |
| 6,853,064 B2 * | 2/2005 | Bolken et al. | 257/686 |
| 6,897,553 B2 | 5/2005 | King et al. | |
| 6,899,534 B2 | 5/2005 | Tandy | |
| 7,061,087 B2 * | 6/2006 | Kim | 257/686 |
| 7,075,188 B2 | 7/2006 | Kato et al. | |
| 7,087,989 B2 | 8/2006 | Nakayama | |
| 7,091,581 B1 * | 8/2006 | McLellan et al. | 257/673 |

(Continued)

FOREIGN PATENT DOCUMENTS

JP    08222692    8/1996

(Continued)

*Primary Examiner*—Jeremy C Norris
*Assistant Examiner*—Yuriy Semenenko
(74) *Attorney, Agent, or Firm*—Mikio Ishimaru

(57) ABSTRACT

An offset integrated circuit package-on-package stacking system is provided including providing a base substrate, providing an array of contact pads on the base substrate, mounting an active component and an optional passive component on the base substrate, injecting a mold cap on the base substrate, mounting an offset package on the base substrate and the mold cap, and singulating a package-on-package from the base substrate.

20 Claims, 8 Drawing Sheets

U.S. PATENT DOCUMENTS

| | | |
|---|---|---|
| 7,095,104 B2 | 8/2006 | Blackshear |
| 7,230,329 B2 | 6/2007 | Sawamoto et al. |
| 7,312,519 B2 | 12/2007 | Song et al. |
| 7,420,269 B2 | 9/2008 | Ha et al. |
| 2004/0021230 A1 | 2/2004 | Tsai et al. |
| 2004/0026789 A1 | 2/2004 | Michii |
| 2004/0036182 A1 | 2/2004 | Corisis et al. |
| 2004/0195700 A1 | 10/2004 | Liu |
| 2006/0139902 A1* | 6/2006 | Happoya .................... 361/760 |
| 2007/0241442 A1 | 10/2007 | Ha et al. |
| 2008/0029858 A1* | 2/2008 | Merilo et al. ............... 257/668 |
| 2008/0136006 A1 | 6/2008 | Jang et al. |
| 2008/0136007 A1 | 6/2008 | Kim et al. |

FOREIGN PATENT DOCUMENTS

| | | |
|---|---|---|
| JP | 2001044362 | 2/2001 |
| JP | 2005101132 | 4/2005 |

* cited by examiner

OFFSET INTEGRATED CIRCUIT PACKAGE-ON-PACKAGE STACKING SYSTEM

CROSS-REFERENCE TO RELATED APPLICATION(S)

This application claims the benefit of U.S. Provisional Patent Application Ser. No. 60/594,887 filed May 16, 2005.

The present application contains subject matter related to concurrently filed U.S. patent application Ser. No. 11/383,403 by Shim et al. entitled "Offset Integrated Circuit Package-on-Package Stacking System". The related application is assigned to STATS ChipPAC Ltd.

TECHNICAL FIELD

The present invention relates generally to integrated circuit package systems, and more particularly to a system for a system for integrated circuit package system having stacked packages.

BACKGROUND ART

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a PCB substrate onto which a set of separate integrated circuit components is directly attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover the substrate and integrated circuit are often damaged during assembly or testing, complicating the manufacturing process and increasing costs. The vertically stacked integrated circuit problems can be greater than the benefits.

Thus, a need still remains for improved packaging methods, systems, and designs. In view of the ever-increasing need to save costs and improve efficiencies, it is more and more critical that answers be found to these problems. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an offset integrated circuit package-on-package stacking system including providing a base substrate, providing an array of contact pads on the base substrate, mounting an active component and an optional passive component on the base substrate, injecting a mold cap on the base substrate, mounting an offset package on the base substrate and the mold cap, and singulating a package-on-package from the base substrate.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
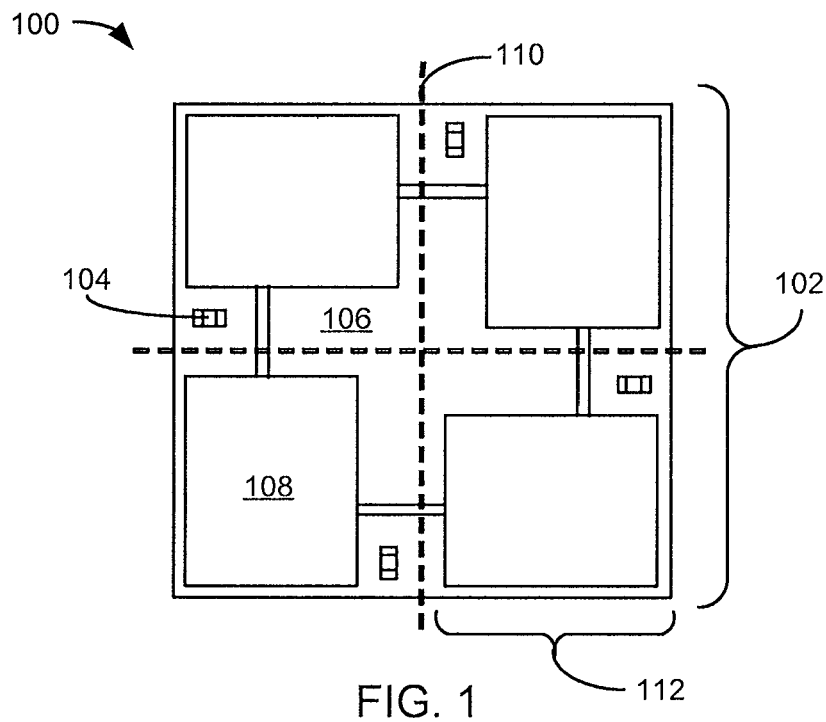
FIG. 1 is a top view of an offset integrated circuit package-on-package stacking system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the base substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Referring now to FIG. 1, therein is shown a top view of an offset integrated circuit package-on-package stacking system 100, in an embodiment of the present invention. The top view of the offset integrated circuit package-on-package stacking system 100 depicts a base package 102 having a discrete component 104 mounted on the base package 102. A mold cap 106 is positioned in the center of the base package 102. An offset package 108 is mounted in the corners of the base package 102 leaving a top surface of the mold cap 106 exposed. Singulation lines 110 divide the substrate into sections 112.

The base package 102 has a rotational symmetry, meaning that each of the sections 112 has a 90° rotation about the center of the geometry of the base package 102 from the sections 112 to which it is adjacent.

Figure 2:
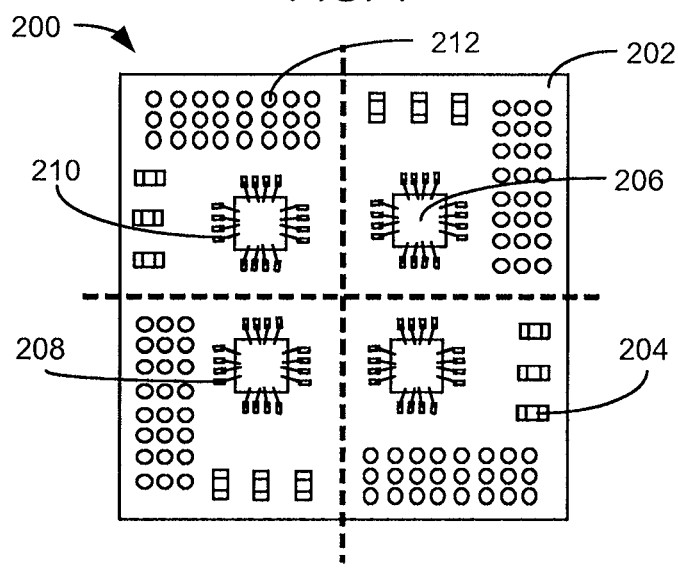
FIG. 2 is a top view of a base substrate assembly of the integrated circuit package-on-package stacking system, of FIG. 1.

Referring now to FIG. 2, therein is shown a top view of a base substrate assembly 200 of the offset integrated circuit package-on-package stacking system 100, of FIG. 1. The top view of the base substrate assembly 200 depicts a base substrate top surface 202, having optional passive components 204 mounted on the sections 112, of FIG. 1. An active component 206, such as an integrated circuit, is mounted on the base substrate top surface 202 and is electrically connected to bonding pads 208 by bond wires 210. An array of contact pads 212 is placed in the corner of the sections 112. The geometry of the sections 112, including the position of the optional passive components 204 and the array of contact pads 212 is rotated by 90°, about the center of the section 112, between adjacent sections 112. This relationship is termed rotational symmetry.

Figure 3:
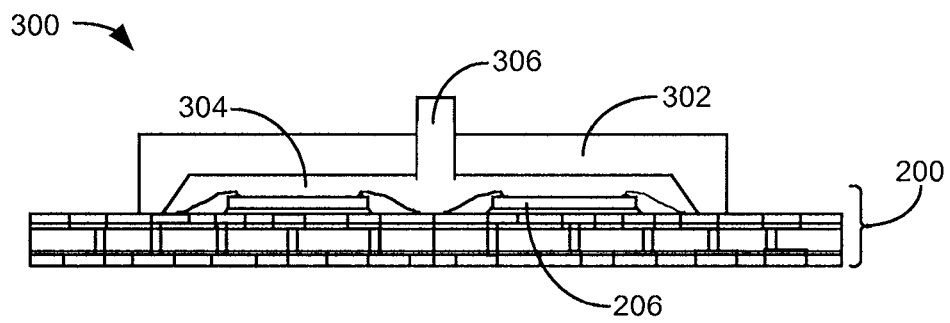
FIG. 3 is a cross-sectional view of a package molding device on the base substrate assembly, of FIG. 2.

Referring now to FIG. 3, therein is shown a cross-sectional view of a package molding device 300 on the base substrate assembly 200, of FIG. 2. The cross-sectional view of the package molding device 300 depicts the base substrate assembly 200 with a mold chase 302 on the base substrate top surface 202, of FIG. 2. The mold chase 302 is used to shape a packaging material 304, such as a plastic or a ceramic material that is injected through a mold gate 306, such as a top mold gate, into a cavity of the mold chase 302, utilizing a top gate molding technique. The packaging material 304 forms a protective barrier around the components under the mold chase, such as the optional passive components 204, of FIG. 2, and the active component 206, of FIG. 2.

Figure 4:
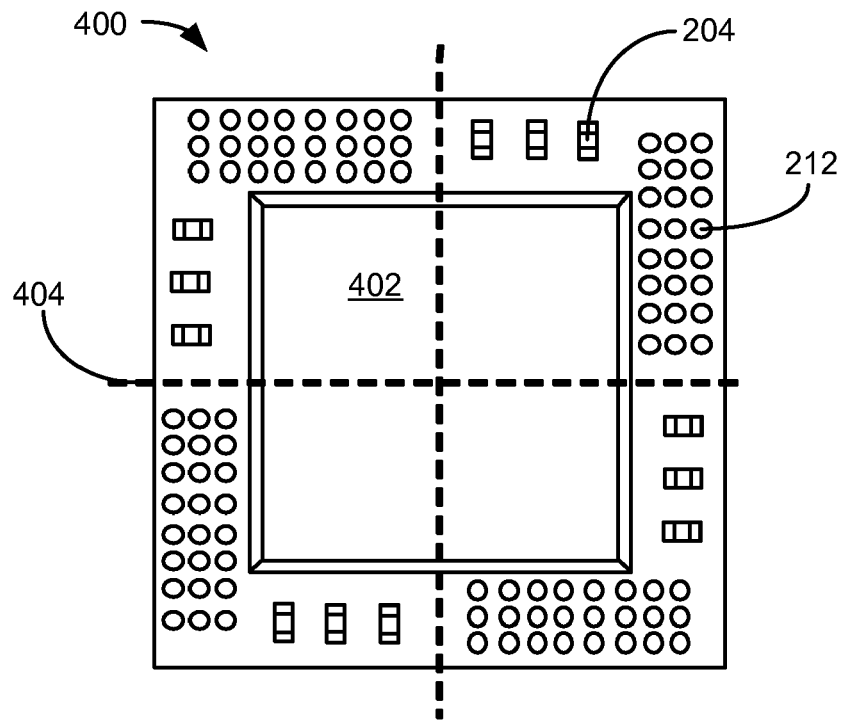
FIG. 4 is a top view of the base package prior to singulation.

Referring now to FIG. 4, therein is shown a top view of a base package 400 prior to singulation. The top view of the base package 400 including the base substrate top surface 202, of FIG. 2, the optional passive components 204, of FIG. 2, and the array of contact pads 212, of FIG. 2, arranged around a single mold cap 402. A set of singulation lines 404 divide the single mold cap 402 into sections. Each of the sections has a rotational symmetry relative to its adjacent sections. The rotational symmetry provides an equivalent pattern in each section rotated 90° relative to the adjacent sections.

Figure 5:
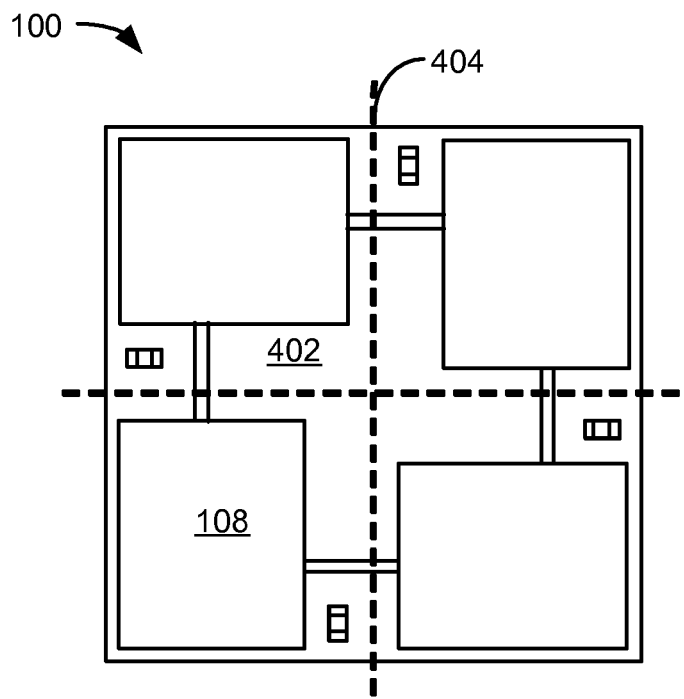
FIG. 5 is a top view of the offset integrated circuit package-on-package stacking system, with the base package of FIG. 4.

Referring now to FIG. 5, therein is shown a top view of the offset integrated circuit package-on-package stacking system 100, with the base package of FIG. 4. The top view of the offset integrated circuit package-on-package stacking system 100 depicts the base package 400 with the offset package 108, of FIG. 1, mounted in each of the sections formed by the set of singulation lines 404, of FIG. 4. The offset package 108 is arranged in a rotational symmetry. Each of the offset package 108 are rotated 90° relative to the offset package 108 in the adjacent sections. The offset package 108 is mounted over the corner of the single mold cap 402. This configuration allows interconnect between the circuit in the base package 400 and the circuit in the offset package 108. Some of the signals may go directly to the printed circuit board (not shown) as well.

Figure 6:
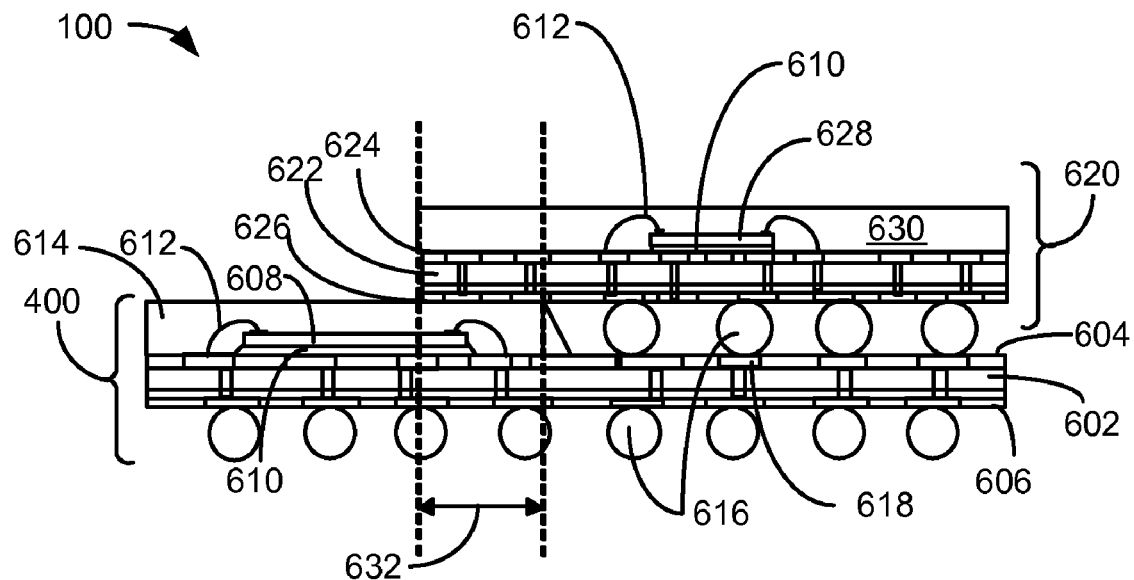
FIG. 6 is a cross-sectional view of the offset integrated circuit package-on-package stacking system, of FIG. 5.

Referring now to FIG. 6, therein is shown a cross-sectional view of the offset integrated circuit package-on-package stacking system 100, of FIG. 5. The cross-sectional view of the offset integrated circuit package-on-package stacking system 100 depicts the base package 400, of FIG. 4, such as a ball grid array package, having a base substrate 602 with a base top surface 604 and a base bottom surface 606. A first integrated circuit 608 is mounted on the base top surface 604 with an adhesive 610, such as die attach material. The first integrated circuit 608 is coupled to the base top surface 604 by electrical interconnects 612, such as bond wires, solder bumps, solder columns or stud bumps. A base mold cap 614, such as molding compound, is injection molded around the first integrated circuit 608, the electrical interconnects 612 and a portion of the base top surface 604. System interconnects 616, such as solder balls, solder column interposers or stud bumps, are attached to the base bottom surface 606 for attachment to the next level of system (not shown). An array of contact pads 618 is distributed in an area around the base mold cap 614.

An offset package 620, having an offset substrate 622 with a top surface 624 and a bottom surface 626, is mounted in an offset position on the base package 400. The offset package 620 has a second integrated circuit 628 mounted on the top surface 624 with the adhesive 610. The second integrated circuit 628 is coupled to the top surface 624 by the electrical interconnects 612. An offset package body 630, such as the molding compound, is injection molded over the second integrated circuit 628, the top surface 624 and the electrical interconnects 612. The system interconnects 616 are attached to the bottom surface 626, of the offset substrate 622. The offset package 620 is mounted on the base package 400, so that the bottom surface 626 of the offset substrate 622 rests on the base mold cap 614 and the system interconnects 616. An overlap region 632 establishes an area of stability that assists in keeping the system interconnects from collapsing during the reflow process. This configuration reduces the space required on a printed circuit board (not shown), while maintaining a low profile over a portion of the offset integrated circuit package-on-package stacking system 100.

Figure 7:
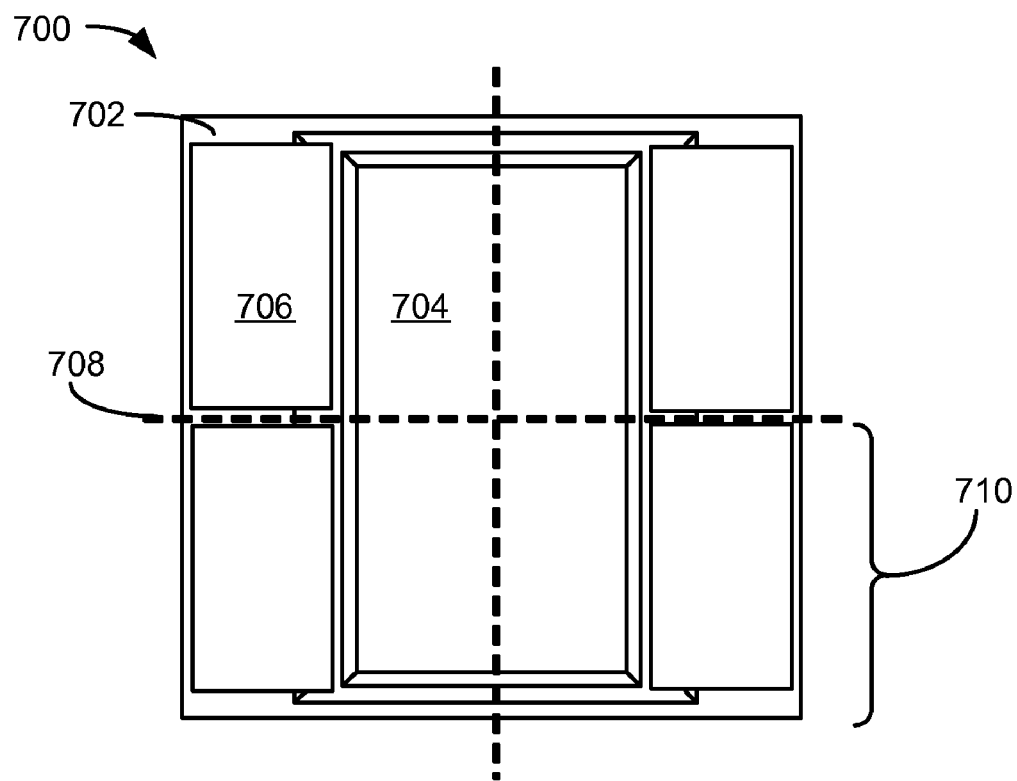
FIG. 7 is a top view of a dual profile mold cap package in an alternative embodiment of the present invention.

Referring now to FIG. 7, therein is shown a top view of a dual profile mold cap package 700 in an alternative embodiment of the present invention. The top view of the dual profile mold cap package 700 depicts a base package 702 having a dual profile mold cap 704 positioned in the center of the base package 702. An offset package 706 is mounted in the corners of the base package 702. Singulation lines 708 divide the substrate into sections 710. The base package 702 has a mirror symmetry of the sections 710, meaning that each of the sections 710 has an opposite or mirrored symmetry from the sections 710 on the other side of the reflection line, which is also one of the singulation lines 708.

Figure 8:
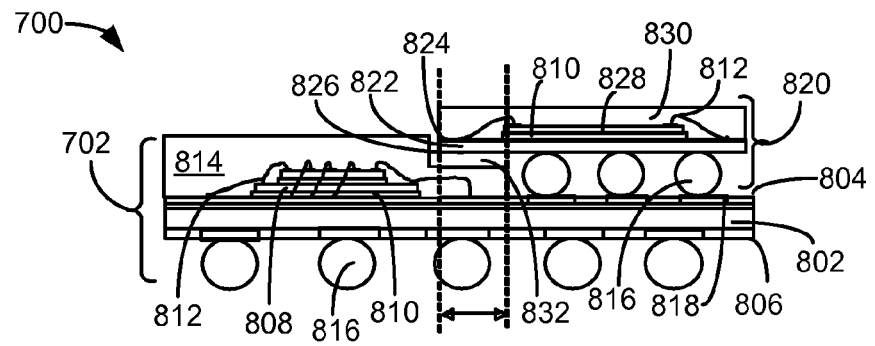
FIG. 8 is a cross-sectional view of the dual profile mold cap, of FIG. 7.

Referring now to FIG. 8, therein is shown a cross-sectional view of the dual profile mold cap package 700, of FIG. 7. The cross-sectional view of the dual profile mold cap package 700 depicts the base package 702, such as a ball grid array package, having a base substrate 802 with a base top surface 804 and a base bottom surface 806. A first integrated circuit 808 is mounted on the base top surface 804 with an adhesive 810, such as die attach material. The first integrated circuit 808 is coupled to the base top surface 804 by electrical interconnects 812, such as bond wires, solder bumps, solder columns or stud bumps. A base package body 814, such as molding compound, is injection molded around the first integrated circuit 808, the electrical interconnects 812 and a portion of the base top surface 804. The base package body 814 has two distinct thicknesses. A step down flange area extends around the perimeter of the base package body 814. The step up area may house a multiple integrated circuit stack for higher levels of integration. The step down flange is thinner than the step up area of the base package body 814. System interconnects 816, such as solder balls, solder column interposers or stud bumps, are attached to the base bottom surface 806 for attachment to the next level of system (not shown). An array of contact pads 818 is distributed in an area around the base package body 814.

An offset package 820, having an offset substrate 822 with a top surface 824 and a bottom surface 826, is mounted in an offset position on the base package 702. The offset package 820 has a second integrated circuit 828 mounted on the top surface 824 with the adhesive 810. The second integrated circuit 828 is coupled to the top surface 824 by the electrical interconnects 812. An offset package body 830, such as the molding compound, is injection molded over the second integrated circuit 828, the top surface 824 and the electrical interconnects 812. The system interconnects 816 are attached to the bottom surface 826, of the offset substrate 822. The offset package 820 is mounted on the base package 702, so that the bottom surface 826 of the offset substrate 822 rests on a gap filler 832, such as die attach material, on the step down flange of the base package body 814 and the system interconnects 816. This configuration reduces the space required on a printed circuit board (not shown), while maintaining a low profile over a portion of the offset integrated circuit package-on-package stacking system 100.

Figure 9:
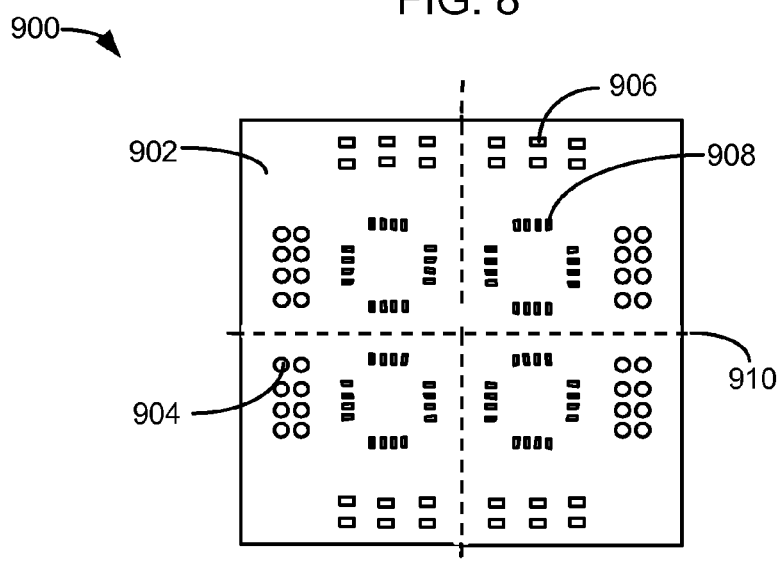
FIG. 9 is a top view of a base substrate, with mirror symmetry, in an embodiment of the present invention.

Referring now to FIG. 9, therein is shown a top view of a base substrate 900, with mirror symmetry, in an embodiment of the present invention. The top view of the base substrate 900 depicts a base substrate top surface 902 having an array of contact pads 904 adjacent to an edge of the base substrate top surface 902. An array of passive component contacts 906 is aligned near another edge of the base substrate top surface 902. An array of an active component bonding pad 908 is positioned near the center of the base substrate top surface 902. The active component bonding pad 908 may be used for wire bonding an active component (not shown) or it could be used for a flipchip type of attachment. A singulation line 910 also acts as a reflection line as the elements on the base substrate top surface 902 are arranged in a mirror symmetry. A mirror image die is needed for this configuration.

Figure 10:
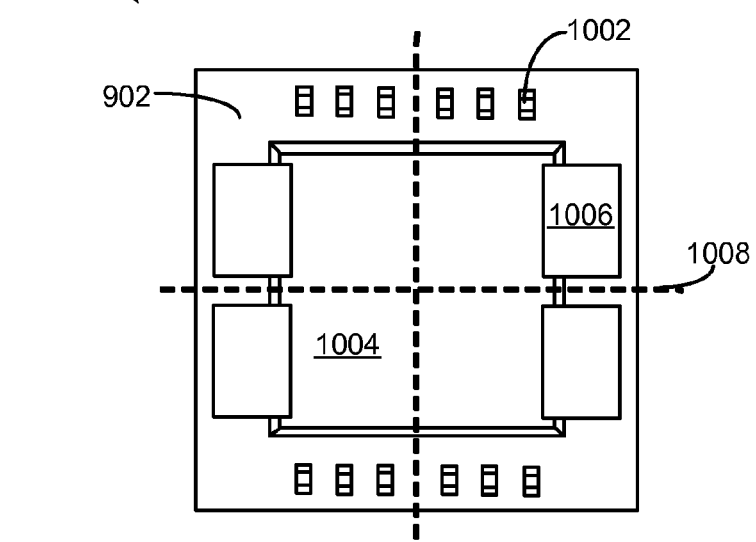
FIG. 10 is a top view of an offset integrated circuit package-on-package stacking system, utilizing the base substrate of FIG. 9.

Referring now to FIG. 10, therein is shown a top view of an offset integrated circuit package-on-package stacking system 1000, utilizing the base substrate of FIG. 9. The top view of the offset integrated circuit package-on-package stacking system 1000 depicts the base substrate top surface 902 with an optional passive component 1002 mounted in an array near an edge of the base substrate top surface 902. A base mold cap 1004 is positioned in the center of the base substrate top surface 902. An offset package 1006 is mounted on the base substrate top surface 902 and the base mold cap 1004. The offset package 1006 edge is in alignment with the edge of the base mold cap 1004.

Figure 11:
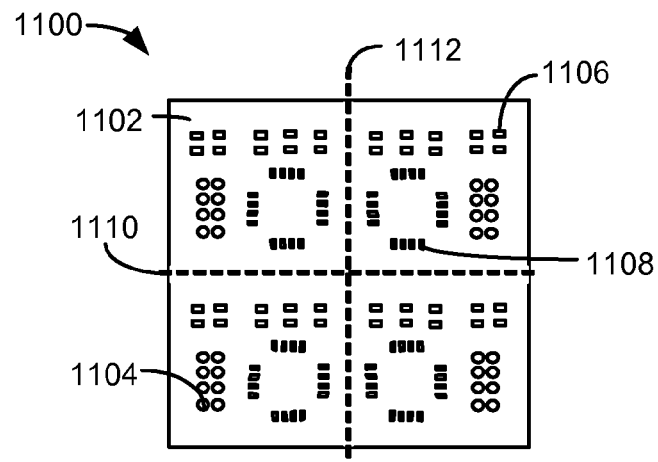
FIG. 11 is a top view of a base substrate, with a combination of translation symmetry and mirror symmetry.

Referring now to FIG. 11, therein is shown a top view of a base substrate 1100, with a combination of translation symmetry and mirror symmetry. The top view of the base substrate 1100 depicts a base substrate top surface 1102 having an array of contact pads 1104 adjacent to an edge of the base substrate top surface 1102. An array of passive component contacts 1106 is aligned near another edge of the base substrate top surface 1102. An array of an active component bonding pad 1108 is positioned between the arrays of the contact pad 1104. The active component bonding pad 1108 may be used for wire bonding an active component (not shown) or it could be used for a flipchip type of attachment. A central line 1110 also acts as a singulation line and serves to separate the sections showing translation symmetry. A symmetrical line 1112 acts as a reflective line as the elements on the base substrate top surface 1102 are arranged in a mirror symmetry on either side of the symmetrical line 1112.

Figure 12:
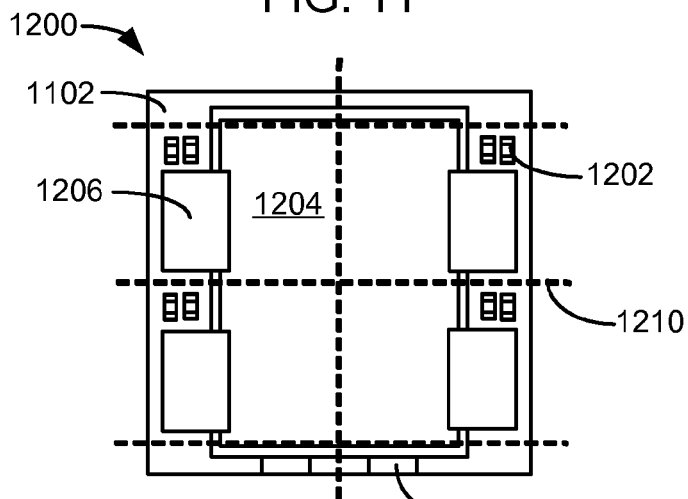
FIG. 12 is a top view of an offset integrated circuit package-on-package stacking system, utilizing the base substrate of FIG. 11.

Referring now to FIG. 12, therein is shown a top view of an offset integrated circuit package-on-package stacking system 1200, utilizing the base substrate of FIG. 11. The top view of the offset integrated circuit package-on-package stacking system 1200 depicts the base substrate top surface 1102 having optional passive component 1202 attached. A base mold cap 1204 resides in the central area of the base substrate top surface 1102 with offset package 1206 mounted on the base substrate top surface 1102 and the base mold cap 1204. A mold gate 1208 is positioned at one end of the base substrate top surface 1102. The mold gate 1208 is used during the injection of the base mold cap 1204 which uses a side gate molding technique. A singulation line 1210 indicates how the offset integrated circuit package-on-package stacking system 1200 will be divided as the final process step.

Figure 13:
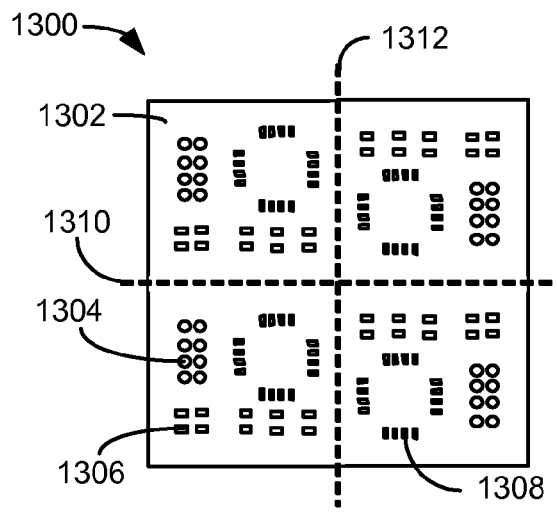
FIG. 13 is a top view of a base substrate, with a combination of translation symmetry and rotational symmetry.

Referring now to FIG. 13, therein is shown a top view of a base substrate 1300, with a combination of translation symmetry and rotational symmetry.

The top view of the base substrate 1300 depicts a base substrate top surface 1302 having an array of contact pads 1304 adjacent to an edge of the base substrate top surface 1302. An array of passive component contacts 1306 is aligned near another edge of the base substrate top surface 1302. An array of an active component bonding pad 1308 is positioned between the arrays of the contact pad 1304. The active component bonding pad 1308 may be used for wire bonding an active component (not shown) or it could be used for a flipchip type of attachment.

A central line 1310 also marks the singulation path and serves to separate the sections showing translation symmetry. A singulation line 1312 separates the geometries on the base substrate top surface 1302, which are arranged in a 180° rotation, about the center of the section, on either side of the singulation line 1312. It is noted that these geometries are replicated below the central line 1310.

Figure 14:
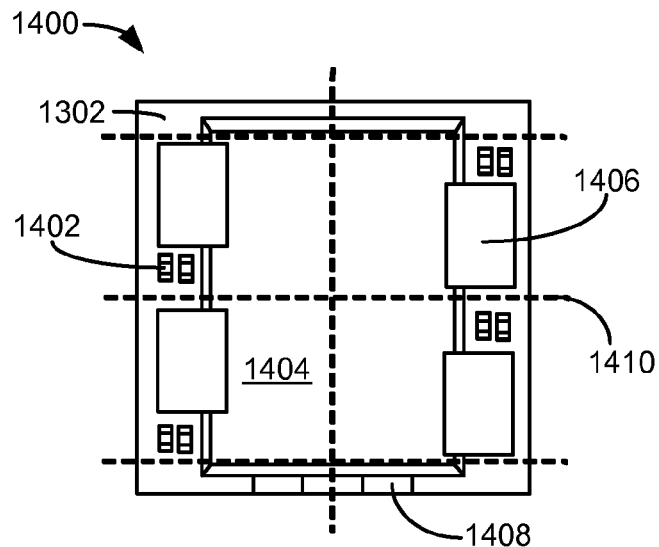
FIG. 14 is a top view of an offset integrated circuit package-on-package stacking system, utilizing the base substrate of FIG. 13.

Referring now to FIG. 14, therein is shown a top view of an offset integrated circuit package-on-package stacking system 1400, utilizing the base substrate of FIG. 13. The top view of the offset integrated circuit package-on-package stacking system 1400 depicts the base substrate top surface 1302 having optional passive component 1402 attached. A base mold cap 1404 resides in the central area of the base substrate top surface 1302 with offset package 1406 mounted on the base substrate top surface 1302 and the base mold cap 1404. A mold gate 1408 is positioned at one end of the base substrate top surface 1302. The mold gate 1408 is used during the injection of the base mold cap 1404 which uses a side gate molding technique. A singulation line 1410 indicates how the offset integrated circuit package-on-package stacking system 1400 will be divided as the final process step.

Figure 15:
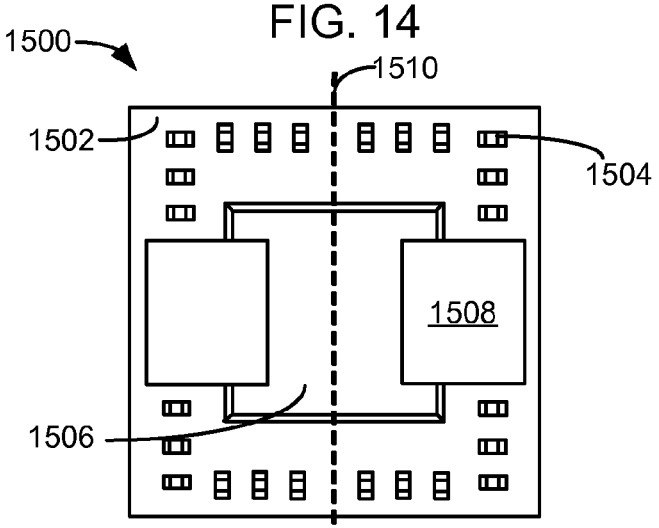
FIG. 15 is a top view of an offset integrated circuit package-on-package stacking system, in another alternative embodiment of the present invention.

Referring now to FIG. 15, therein is shown a top view of an offset integrated circuit package-on-package stacking system 1500, in another alternative embodiment of the present invention. The top view of the offset integrated circuit package-on-package stacking system 1500 depicts a base substrate top surface 1502 having an optional passive component 1504 attached. A base mold cap 1506 resides in the central area of the base substrate top surface 1502 with offset package 1508 mounted on the base substrate top surface 1502 and the base mold cap 1506. A singulation line 1510 indicates how the offset integrated circuit package-on-package stacking system 1500 will be divided as the final process step.

Figure 16:
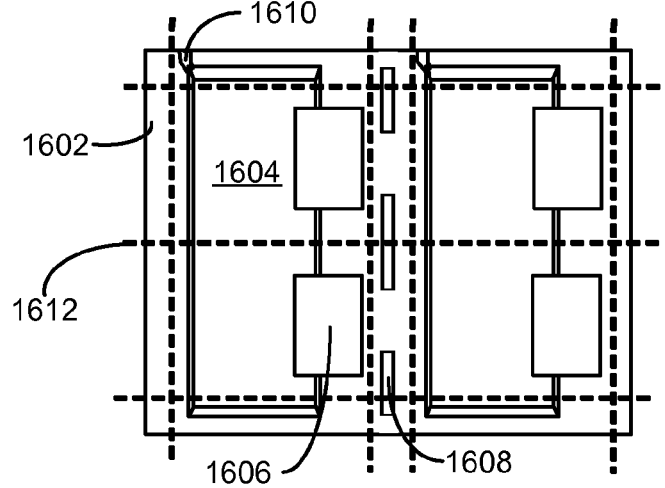
FIG. 16 is a top view of an offset integrated circuit package-on-package stacking system, in yet another alternative embodiment of the present invention.

Referring now to FIG. 16, therein is shown a top view of an offset integrated circuit package-on-package stacking system 1600, in yet another alternative embodiment of the present invention. The top view of the offset integrated circuit package-on-package stacking system 1600 depicts a base substrate top surface 1602, a base mold cap 1604 resides in the central area of the base substrate top surface 1602 with offset package 1606 mounted on the base substrate top surface 1602 and the base mold cap 1604. Multiple copies of the base substrate top surface 1602 are joined with a separation slot 1608 defining the boundary. A side mold gate 1610 is used during the injection process to form the base mold cap 1604. A singulation line 1612 indicates how the offset integrated circuit package-on-package stacking system 1600 will be divided as the final process step.

Figure 17:
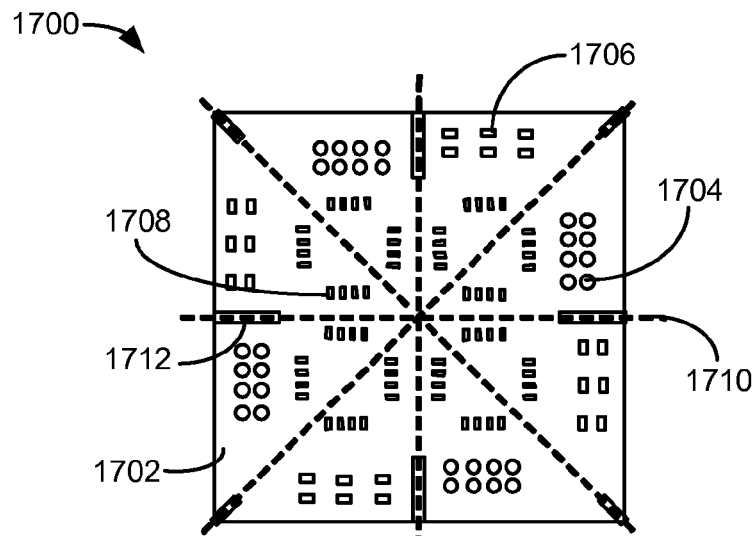
FIG. 17 is a top view of a base substrate, with openings.

Referring now to FIG. 17, therein is shown a top view of a base substrate 1700, with openings. The top view of the base substrate 1700 depicts a base substrate top surface 1702 having an array of contact pads 1704 adjacent to an edge of the base substrate top surface 1702. An array of passive component contacts 1706 is aligned near another edge of the base substrate top surface 1702. An array of an active component bonding pad 1708 is positioned between the arrays of the contact pad 1704. The active component bonding pad 1708 may be used for wire bonding an active component (not shown) or it could be used for a flipchip type of attachment. Singulation lines 1710 also marks the separation path and serves to separate the sections showing rotational symmetry. A substrate slot 1712 acts as a guide line as the geometries on the base substrate top surface 1702 are arranged in a 90° rotation, about the center of the section, on either side of the singulation line 1710. The substrate slot 1712 located on the diagonal are for stress relief during the assembly process and are not used for singulation.

Figure 18:
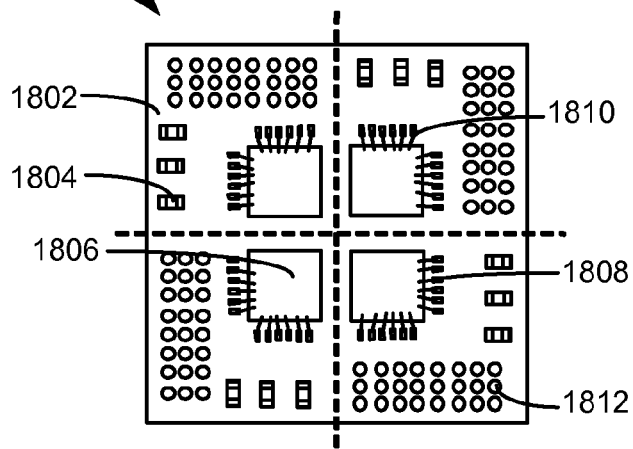
FIG. 18 is a top view of a base substrate assembly, with rotational symmetry.

Referring now to FIG. 18, therein is shown a top view of a base substrate assembly 1800, with rotational symmetry. The top view of the base substrate assembly 1800 depicts a base substrate top surface 1802, having optional passive components 1804 mounted on the base substrate top surface 1802. An integrated circuit 1806 is mounted on the base substrate top surface 1802 and is electrically connected to bonding pads 1808 by bond wires 1810. An array of contact pads 1812 is placed at an edge of the base substrate top surface 1802. The geometries, which include the position of the optional passive components 1804 and the array of contact pads 1812, are rotated by 90° about the center of the section between each of the sections. This relationship is termed rotational symmetry.

Figure 19:
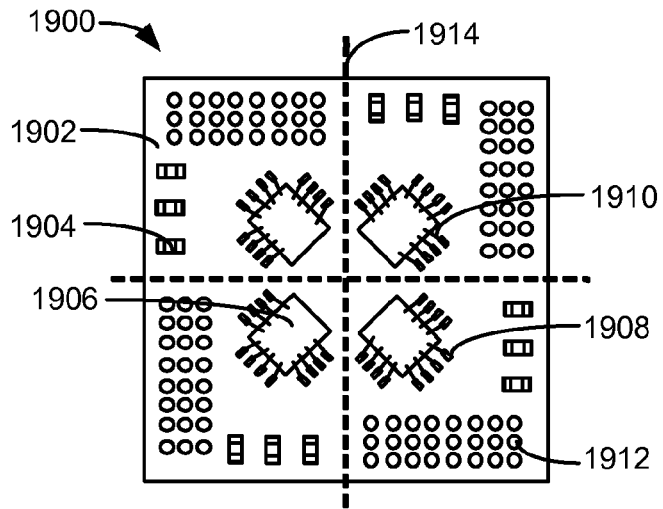
FIG. 19 is a top view of a base substrate assembly, with an angular offset semiconductor die.

Referring now to FIG. 19, therein is shown a top view of a base substrate assembly 1900, with an angular offset semiconductor die. The top view of the base substrate assembly 1900 depicts a base substrate top surface 1902, having optional passive components 1904 mounted on the base substrate top surface 1902. An integrated circuit 1906 is mounted on the base substrate top surface 1902 and is electrically connected to bonding pads 1908 by bond wires 1910. An array of contact pads 1912 is placed at an edge of the base substrate top surface 1902. The geometries, which include the position of the optional passive components 1904 and the array of contact pads 1912, are rotated by 90° about the center of the section between adjacent sections. This relationship is termed rotational symmetry. This configuration allows each of the integrated circuit 1906 to be placed, near a singulation line 1914, in an angular offset manner to relieve the substrate routing space constraint.

Figure 20:
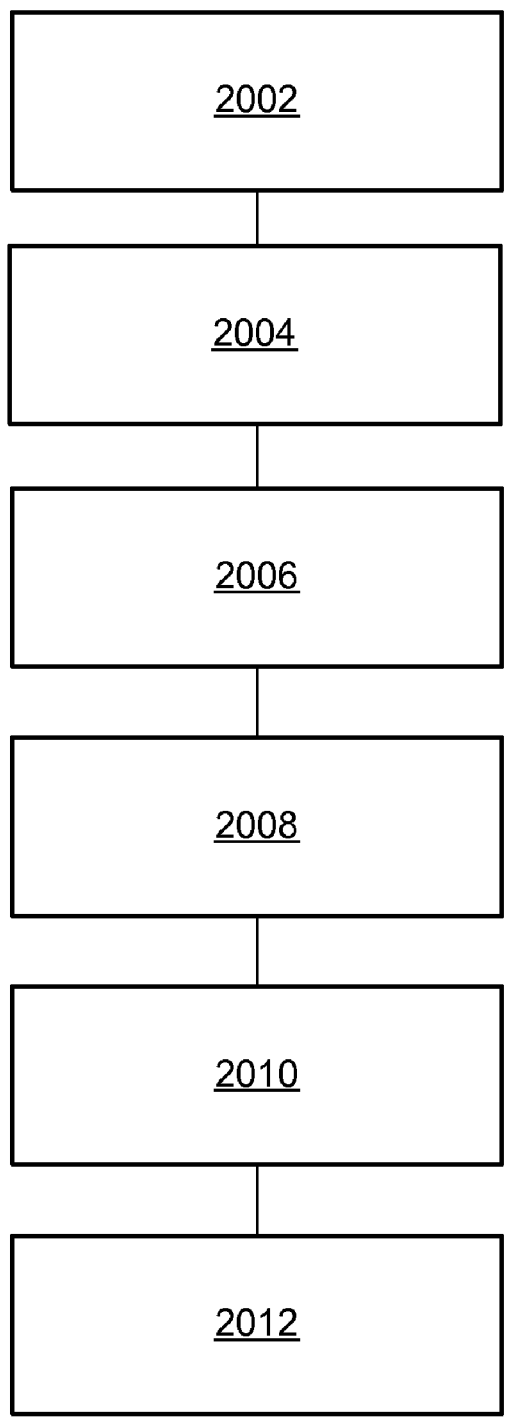
FIG. 20 is a flow chart of an offset integrated circuit package-on-package stacking system for manufacturing an offset integrated circuit package-on-package stacking system, in an embodiment of the present invention.

Referring now to FIG. 20, therein is shown a flow chart of an offset integrated circuit package-on-package stacking system 2000 for manufacturing an offset integrated circuit package-on-package stacking system 100, in an embodiment of the present invention. The system 2000 includes providing a base substrate in a block 2002; providing an array of contact pads on the base substrate in a block 2004; mounting an active component and an optional passive component on the base substrate in a block 2006; injecting a mold cap on the base substrate in a block 2008; mounting an offset package on the base substrate and the mold cap in a block 2010; and singulating a package-on-package from the base substrate in a block 2012.

It has been discovered that the present invention thus has numerous advantages.

A principle advantage is that the present invention provides an increase in integrated circuit density without consuming additional space on the printed circuit board.

Another advantage is the device can produce high yields due to the fact that all of the integrated circuits can be tested prior to packaging.

Yet another important advantage of the present invention is that it valuably supports and services the historical trend of reducing costs, simplifying systems, and increasing performance.

These and other valuable aspects of the present invention consequently further the state of the technology to at least the next level.

Thus, it has been discovered that the offset integrated circuit package-on-package system of the present invention furnishes important and heretofore unknown and unavailable solutions, capabilities, and functional aspects for high density integrated circuit packaging. The resulting processes and configurations are straightforward, cost-effective, uncomplicated, highly versatile and effective, can be implemented by adapting known technologies, and are thus readily suited for efficiently and economically manufacturing package-on package devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method of manufacturing an offset integrated circuit package-on-package stacking system comprising:
   providing a base substrate;
   providing an array of contact pads on the base substrate;
   mounting an active component and an optional passive component on the base substrate;
   forming a mold cap on the base substrate;
   mounting an offset package on the base substrate and the mold cap including leaving a portion of a top surface of the mold cap exposed; and
   singulating a package-on-package.

2. The method as claimed in claim 1 further comprising providing a dual profile mold cap on the base substrate.

3. The method as claimed in claim 1 further comprising providing a gap filler between the offset package and a step down flange of a dual profile mold cap.

4. The method as claimed in claim 1 further comprising providing a system interconnect between the offset package and the array of contact pads on the base substrate.

5. The method as claimed in claim 1 further comprising providing an overlap region between the base mold cap and the offset package.

6. A method of manufacturing an offset integrated circuit package-on-package stacking system comprising:
   providing a base substrate;
   providing an array of contact pads on the base substrate;
   mounting an active component and an optional passive component on the base substrate forms sections on the base substrate, providing a mirrored symmetry, a rotational symmetry, a translation symmetry, or a combination thereof among the sections;
   injecting a mold cap on the base substrate using a mold gate positioned at the edge of a base substrate top surface;
   mounting an offset package on the base substrate and the mold cap including leaving a portion of a top surface of the mold cap exposed; and
   singulating a package-on-package.

7. The method as claimed in claim 6 further comprising providing a dual profile mold cap on the base substrate, where the dual profile mold cap includes a step down flange around the perimeter.

8. The method as claimed in claim 6 further comprising providing a gap filler between the offset package and a step down flange of a dual profile mold cap, where providing the gap filler includes providing a die attach material.

9. The method as claimed in claim 6 further comprising providing a system interconnect between the offset package and the array of contact pads on the base substrate, in which the system interconnect includes providing a solder ball.

10. The method as claimed in claim 6 further comprising providing an overlap region between the base mold cap and the offset package, where the overlap region is located over a corner, over an edge, or a combination thereof.

11. An offset integrated circuit package-on-package stacking system comprising:
    a base substrate;
    an array of contact pads on the base substrate;
    an active component and an optional passive component on the base substrate;
    a mold cap on the base substrate; and
    an offset package on the base substrate and the mold cap includes a portion of a top surface of the mold cap exposed.

12. The system as claimed in claim 11 further comprising a dual profile mold cap on the base substrate.

13. The system as claimed in claim 11 further comprising a gap filler between the offset package and a step down flange of a dual profile mold cap.

14. The system as claimed in claim 11 further comprising a system interconnect between the offset package and the array of contact pads on the base substrate.

15. The system as claimed in claim 11 further comprising an overlap region between the base mold cap and the offset package.

16. The system as claimed in claim 11 further comprising:
    sections formed on the base substrate provide a mirrored symmetry, a rotational symmetry, a translation symmetry, or a combination thereof among the sections; and
    a mold gate positioned at the edge of a base substrate top surface.

17. The system as claimed in claim 16 further comprising a dual profile mold cap on the base substrate, where the dual profile mold cap includes a step down flange around the perimeter.

18. The system as claimed in claim 16 further comprising a gap filler between the offset package and a step down flange of a dual profile mold cap, in which the gap filler includes a die attach material provided.

19. The system as claimed in claim 16 further comprising a system interconnect between the offset package and the array of contact pads on the base substrate, in which the system interconnect includes a solder ball.

20. The system as claimed in claim 16 further comprising an overlap region between the base mold cap and the offset package, where the overlap region is located over a corner, over an edge, or a combination thereof.

* * * * *

UNITED STATES PATENT AND TRADEMARK OFFICE
CERTIFICATE OF CORRECTION

| | | |
|---|---|---|
| PATENT NO. | : 7,746,656 B2 | Page 1 of 1 |
| APPLICATION NO. | : 11/383407 | |
| DATED | : June 29, 2010 | |
| INVENTOR(S) | : Shim et al. | |

It is certified that error appears in the above-identified patent and that said Letters Patent is hereby corrected as shown below:

Column 4, lines 15-18:

Delete:

"The base package 102 has a rotational symmetry, meaning that each of the sections 112 has a 90° rotation about the center of the geometry of the base package 102 from the sections 112 to which it is adjacent."

and insert therefor

--The base package 102 has a rotational symmetry, meaning that each of the sections 112 has a 90° rotation about the center of the geometry of the base package 102 from the sections 112 to which it is adjacent. The section 112 in the second quadrant is rotated 90° from the first quadrant, and so on.--

Signed and Sealed this
Eighth Day of May, 2012

David J. Kappos
*Director of the United States Patent and Trademark Office*